(12) United States Patent
Kim et al.

(10) Patent No.: US 8,962,437 B2
(45) Date of Patent: Feb. 24, 2015

(54) METHOD FOR FABRICATING CAPACITOR WITH HIGH ASPECT RATIO

(75) Inventors: Beom-Yong Kim, Gyeonggi-do (KR); Kee-Jeung Lee, Gyeonggi-do (KR); Yun-Hyuck Ji, Gyeonggi-do (KR); Seung-Mi Lee, Gyeonggi-do (KR); Jae-Hyoung Koo, Gyeonggi-do (KR); Kwan-Woo Do, Gyeonggi-do (KR); Kyung-Woong Park, Gyeonggi-do (KR); Ji-Hoon Ahn, Gyeonggi-do (KR); Woo-Young Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 24 days.

(21) Appl. No.: 13/494,400

(22) Filed: Jun. 12, 2012

(65) Prior Publication Data
US 2013/0244394 A1    Sep. 19, 2013

(30) Foreign Application Priority Data

Mar. 19, 2012    (KR) .................. 10-2012-0027823

(51) Int. Cl.
*H01L 21/20*    (2006.01)

(52) U.S. Cl.
USPC ............................................ 438/381

(58) Field of Classification Search
USPC ............................................ 438/381
See application file for complete search history.

(56) References Cited

U.S. PATENT DOCUMENTS

| | | | | |
|---|---|---|---|---|
| 4,584,055 A | * | 4/1986 | Kayanuma et al. | 438/705 |
| 4,681,657 A | * | 7/1987 | Hwang et al. | 438/753 |
| 5,928,969 A | * | 7/1999 | Li et al. | 438/753 |
| 6,188,099 B1 | | 2/2001 | Nakatani | |
| 6,229,176 B1 | * | 5/2001 | Hsieh et al. | 257/316 |
| 6,448,165 B1 | * | 9/2002 | Yu et al. | 438/585 |
| 6,599,794 B2 | | 7/2003 | Kiyotoshi et al. | |
| 7,858,486 B2 | | 12/2010 | Manning | |
| 2003/0032304 A1 | * | 2/2003 | Goldbach et al. | 438/770 |
| 2004/0145057 A1 | * | 7/2004 | Choi | 257/758 |
| 2008/0176369 A1 | * | 7/2008 | Satonaka et al. | 438/231 |
| 2009/0090963 A1 | * | 4/2009 | Isobe | 257/326 |
| 2009/0194810 A1 | * | 8/2009 | Kiyotoshi et al. | 257/326 |
| 2010/0155893 A1 | | 6/2010 | Chen et al. | |
| 2011/0294275 A1 | * | 12/2011 | Lee | 438/381 |
| 2012/0034747 A1 | * | 2/2012 | Lin | 438/300 |
| 2013/0137277 A1 | * | 5/2013 | Huang | 438/753 |

FOREIGN PATENT DOCUMENTS

| | | |
|---|---|---|
| JP | 2008-210849 | 9/2008 |
| KR | 1020030035631 | 5/2003 |
| KR | 1020040051070 | 6/2004 |
| KR | 1020050055076 | 6/2005 |
| KR | 1020050092466 | 9/2005 |
| KR | 1020060035473 | 4/2006 |
| KR | 1020100036006 | 4/2010 |
| KR | 1020110131640 | 12/2011 |
| KR | 1020120062988 | 6/2012 |

* cited by examiner

*Primary Examiner* — Charles Garber
*Assistant Examiner* — Brigitte Paterson
(74) *Attorney, Agent, or Firm* — IP & T Group LLP

(57) ABSTRACT

A method for fabricating a capacitor includes: forming a first silicon layer over a semiconductor substrate, where the first silicon layer is doped with a dopant; forming an undoped second silicon layer over the first silicon layer; forming an opening by etching the second silicon layer and the first silicon layer; forming a storage node in the opening; and removing the first silicon layer and the second silicon layer.

6 Claims, 12 Drawing Sheets

METHOD FOR FABRICATING CAPACITOR WITH HIGH ASPECT RATIO

CROSS-REFERENCE TO RELATED APPLICATIONS

The present application claims priority of Korean Patent Application No. 10-2012-0027823, filed on Mar. 19, 2012, which is incorporated herein by reference in its entirety.

BACKGROUND

1. Field

Exemplary embodiments of the present invention relate to a semiconductor device, and more particularly, to a method for fabricating a capacitor.

2. Description of the Related Art

As the integration degree of semiconductor devices increases, the accompanying difficulty in manufacturing technology also increases. In the case of DRAMs, as the design rule parameters shrink, a process for manufacturing high aspect ratio storage nodes is useful.

In the process for forming a storage node, a mold layer is etched to form a hole forming an opening and a storage node is formed in the opening. At this time, in order to increase capacitance proportionally to an increase in height of the storage node, the height of the mold layer is to be increased. The mold layer is generally formed of oxide, and thus referred to as 'mold oxide'. After the storage node is formed, the mold layer is removed by a wet dip-out process.

FIG. 1 is a diagram illustrating a conventional method for fabricating a capacitor.

Referring to FIG. 1, an interlayer dielectric layer 12 is formed over a semiconductor substrate 11, and a storage node contact plug 13 is formed. Subsequently, an etch stop layer 14 and a mold oxide layer 15 are formed over the interlayer dielectric layer 12. The mold oxide layer 15 and the etch stop layer 14 are sequentially etched to form an opening 16.

In order to secure sufficient capacitance, the aspect ratio of the storage node is set to 70 or more, which is considered to be a high aspect ratio.

In the conventional method of FIG. 1, as the height of the storage node is increased to secure capacitance, the depth of the opening 16 increases. Therefore, the etch profile of the opening 16 with a high aspect ratio may be sloped (as illustrated by an area denoted by reference numeral '17') or the opening may not even be opened (as illustrated by an area denoted by reference numeral '18'). When the etch profile is sloped, the structural stability of the storage node decreases. In this case, the storage node may lean during a subsequent dip-out process.

SUMMARY

An embodiment of the present invention is directed to a method for fabricating a capacitor, which is capable of preventing leaning as well as a failure to open and a sloped profile.

In accordance with an embodiment of the present invention, a method for fabricating a capacitor includes: forming a first silicon layer over a semiconductor substrate, wherein the first silicon layer is doped with a dopant; forming an undoped second silicon layer over the first silicon layer; forming an opening by etching the second silicon layer and the first silicon layer; forming a storage node in the opening; and removing the first silicon layer and the second silicon layer.

In accordance with another embodiment of the present invention, a method for fabricating a capacitor includes: forming a first silicon layer over a semiconductor substrate, wherein the first silicon layer has a first doping concentration; forming a second silicon layer over the first silicon layer, wherein the second silicon layer has a second doping concentration; forming an opening by etching the second silicon layer and the first silicon layer; forming a storage node in the opening; and removing the first silicon layer and the second silicon layer.

In accordance with yet another embodiment of the present invention, a method for fabricating a capacitor includes: forming a plurality of silicon layers over a semiconductor substrate, wherein the plurality of silicon layers are doped at different doping concentrations, respectively; forming an opening by etching the plurality of silicon layers; forming a storage node in the opening; and removing the plurality of silicon layers.

In accordance with still another embodiment of the present invention, a method for fabricating a capacitor includes: forming a first silicon layer over a semiconductor substrate, wherein the first silicon layer is doped with a first dopant; forming a second silicon layer over the first silicon layer, wherein the second silicon layer is doped with a second dopant; forming an opening by etching the second silicon layer and the first silicon layer; forming a storage node in the opening; and removing the first silicon layer and the second silicon layer.

In accordance with still another embodiment of the present invention, a method for fabricating a capacitor includes: forming an etch stop layer over a semiconductor substrate having a storage node contact plug formed therein; forming a first silicon layer over the etch stop layer, wherein the first silicon layer is doped with a dopant; forming an undoped second silicon layer over the first silicon layer; forming an opening by etching the second silicon layer and the first silicon layer; forming a silicon oxide layer on sidewalls of the opening by oxidizing the first silicon layer and the second silicon layer; expanding the opening by removing the silicon oxide layer; etching the etch stop layer under the expanded opening; forming a storage node in the expanded opening; and removing the first silicon layer and the second silicon layer.

DETAILED DESCRIPTION

Figure 1:
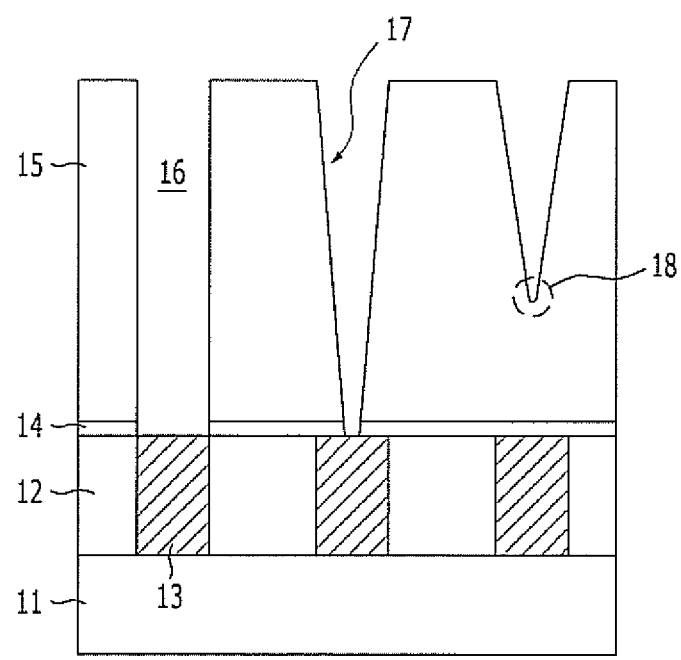
FIG. 1 is a diagram illustrating a conventional method for fabricating a capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the embodiments of the present invention, since at least a silicon layer doped with dopants is applied to form a mold silicon layer, a vertical profile of an opening may be obtained, and a failure to open may be prevented. The mold silicon layer may have a different etch rate due to presence of the dopants. Furthermore, the mold silicon layer may have a different oxidation rate due to the dopants. Furthermore, the dopants cause different etch rates. A doped silicon layer has a higher oxidation rate and a higher etch rate than an undoped silicon layer. For example, the doped silicon layer may exhibit an oxidation rate twenty times larger than the undoped silicon layer. This is because, when the concentration of the dopant increases, vacancies increase at the interface between the silicon layer and a silicon oxide layer, thereby forming a large number of reaction sites.

FIGS. 2A to 2E illustrate a method for fabricating a capacitor in accordance with a first embodiment of the present invention.

Figure 2A:
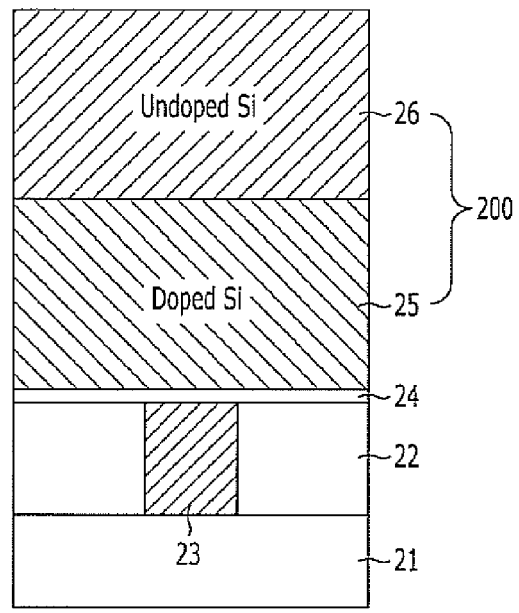
FIGS. 2A to 2E illustrate a method for fabricating a capacitor in accordance with a first embodiment of the present invention.

Referring to FIG. 2A, an interlayer dielectric layer 22 is formed over a semiconductor substrate 21 in which structures such as transistors, word lines, and bit lines are formed. At this time, the interlayer dielectric layer 22 may include any one single layer selected from the group consisting of oxide, nitride, and oxynitride or a stacked layer of two or more foregoing layers. The semiconductor substrate 21 may include a silicon-containing material, and a landing plug and the like may be formed over the semiconductor substrate 21.

A plurality of storage node contact plugs 23 are formed through the interlayer dielectric layer 22. The storage node contact plug 23 may be formed of poly silicon or metal. The metal may include tungsten (W), titanium (Ti), or titanium nitride (TiN). Furthermore, the storage node contact plug 23 may be formed by sequentially stacking a polysilicon layer, a barrier layer, and a metal layer.

An etch stop layer 24 is formed over the interlayer dielectric layer 22 having the storage node contact plugs 23 formed therein. For example, the etch stop layer 24 may be formed of nitride such as silicon nitride.

A mold silicon layer 200 is formed over the etch stop layer 24. The mold silicon layer 200 may include amorphous silicon or polysilicon. The polysilicon forming the mold silicon layer 200 may be formed by crystallizing amorphous silicon.

The mold silicon layer 200 may be formed by stacking a first silicon layer 25 and a second silicon layer 26. Any one of the first and second silicon layers 25 and 26 may be doped, and the other may be undoped. For example, the first silicon layer 25 may be doped, and the second silicon layer 26 may be undoped. In this case, the first silicon layer 25 is doped silicon, and the second silicon layer 26 is undoped silicon. A dopant used to dope the first silicon layer 25 may include boron or phosphorous. The doping concentration of the dopant may be selected from the range of $1 \times 10^{18}$ to $1 \times 10^{22}$ atoms/cm$^3$. The first silicon layer 25 may be heavily doped and may be said to have a heavy doping concentration.

The thicknesses of the first and second silicon layers 25 and 26 may each be set in the range b 1 kÅ to 10 kÅ, and the sum of thicknesses of the first and second silicon layers 25 and 26 may equal 20 kÅ at the maximum. The heights of the first and second silicon layers 25 and 26 may be set differently depending on the height of a storage node.

The first and second silicon layers 25 and 26 may be deposited by chemical vapor deposition (CVD), and deposition equipment may include furnace-type equipment or chamber-type equipment.

The first and second silicon layers 25 and 26 may be formed by a single deposition process or formed by separate deposition processes, respectively. The dopant doped in the first silicon layer 25 may be insitu-doped when the first silicon layer 25 is deposited. For example, $Si_2H_6$ or $SiH_4$ may be used to deposit the first silicon layer 25 while passing $PH_3$.

When the first and second silicon layers 25 and 26 are formed of amorphous silicon, a heat treatment may be performed after the deposition. The first and second silicon layers 25 and 26 may be crystallized by the heat treatment. Therefore, the first and second silicon layers 25 and 26 may become polysilicon layers. The heat treatment may be omitted according to different design needs.

Figure 2B:
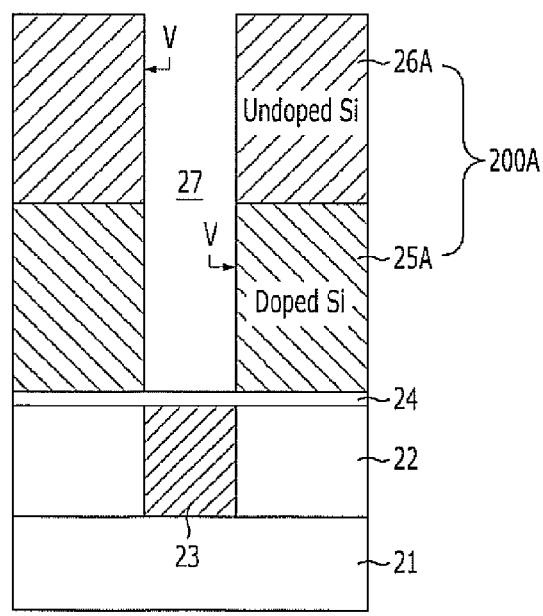

Referring to FIG. 2B, a hard mask pattern (not illustrated) is formed over the mold silicon layer 200. Using the hard mask pattern as an etch barrier, the mold silicon layer 200 including the second silicon layer 26 and the first silicon layer 25 is etched until the etch stop layer 24 is exposed, thereby forming an opening 27. The opening 27 is a region where a storage node is to be formed and may be formed in a hole shape. The etch process for forming the opening 27 may be performed using a dry etch process. For example, the etch process for forming the opening 27 may be performed using a gas mixture in which HBr and $Cl_2$ are mixed. The etch process for forming the opening 27 may include a chemical dry etch process. When the second and first silicon layers 26 and 25 are etched, an etch rate at the first silicon layer 25 is increased due to the presence of the dopant doped in the first silicon layer 25. Accordingly, the sidewalls of the opening 27 have a vertical profile, and a failure to open is prevented. As the doping concentration of the dopant doped in the first silicon layer 25 becomes higher, the etch rate increases. Therefore, an optimized etching rate may be selected by controlling the doping concentration of the dopant.

The opening 27 formed by the above-discussed series of etch processes is formed between stacked structures of first and second silicon layer patterns 25A and 26A of a mold silicon layer pattern 200A. Furthermore, the opening 27 has a vertical profile. Both of the first and second silicon layer patters 25A and 26A have a vertical profile V. Meanwhile, when both of the first and second silicon layers 25 and 26 are undoped, a sloped profile may appear due to the characteristics of the dry etch process. In particular, as the aspect ratio further increases, a sloped profile is more likely to appear. In the first embodiment of the present invention, since the doped first silicon layer 25 is applied, a sloped profile may be prevented, and the vertical profile may be obtained.

Figure 2C:
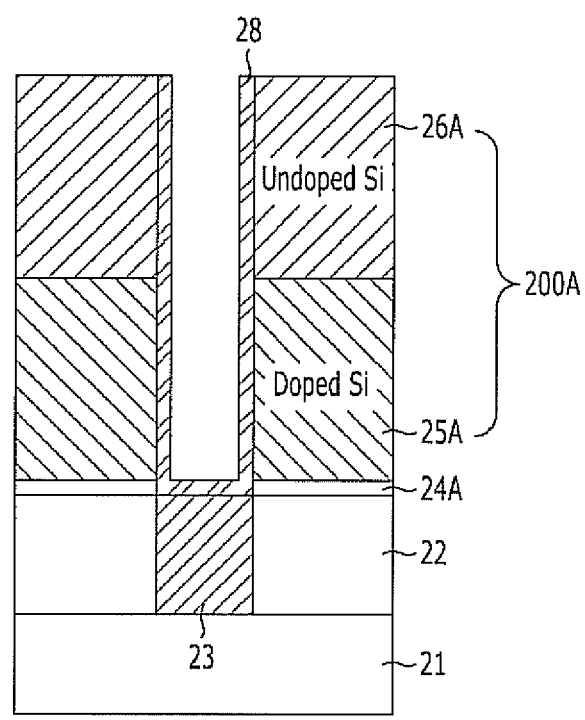

Referring to FIG. 2C, the etch stop layer 24 under the opening 27 is etched to expose the storage node contact plug 23. Hereinafter, the etched etch stop layer 24 is referred to as a reference numeral '24A'.

A storage node 28 is formed in the opening 27. The storage node 28 may include a three-dimensional structure such as a cylinder-type structure or pillar-type structure. In this embodiment of the present invention, a cylinder-type storage node is formed. The storage node 28 may be formed by a storage node separation process. The storage node separation process is performed as follows: a conductive layer is formed on the entire surface of the resultant structure including the opening and subsequently planarized by chemical mechanical polishing (CMP) or the like. Accordingly, the conductive layer is left, for example, only in the opening 27, and the left conductive layer becomes a cylinder-type storage node 28. The storage node 28 may include a metal such as TIN, W, or noble metal.

Figure 2D:
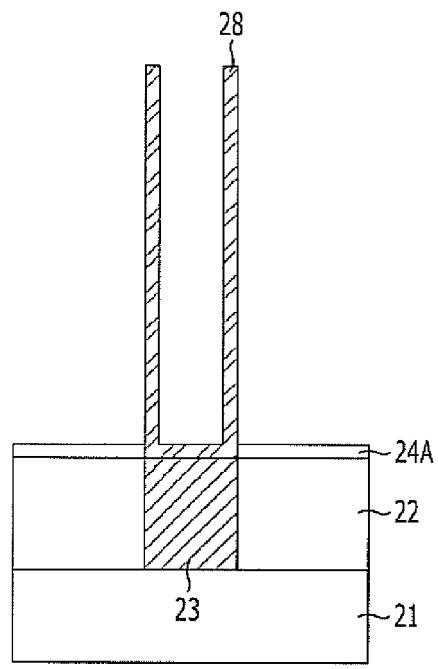

Referring to FIG. 2D, the first and second silicon layer patterns 25A and 26A are removed. The first and second silicon layer patterns 25A and 26A may be removed by a dry etch process or wet etch process. When the first and second silicon layer patterns 25A and 26A are removed by a dry etch process, the dry etch process may be performed using a gas mixture in which HBr and $Cl_2$ are mixed. When the first and second silicon layer patterns 25A and 26A are removed by a wet etch process, the wet etch process may be performed using $HNO_3$.

Figure 2E:
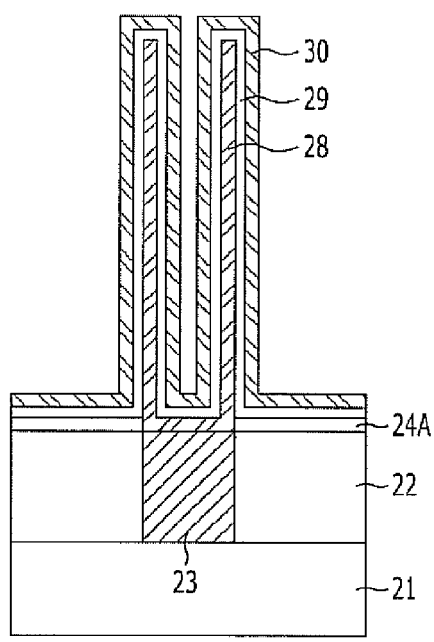

Referring to FIG. 2E, a dielectric layer 29 and a plate node 30 are formed over the storage node 28. The storage node 28 may be referred to as a bottom electrode, and the plate node 30 may be referred to as a top electrode.

Figure 2F:
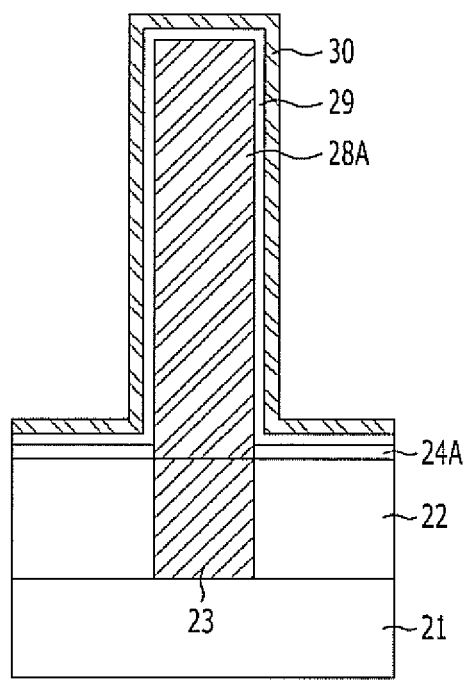
FIG. 2F illustrates a capacitor in accordance with a modification of the first embodiment of the present invention.

FIG. 2F illustrates a capacitor in accordance with a modification of the first embodiment of the present invention. In the capacitor, a storage node 28A has a pillar shape.

FIGS. 3A to 3G illustrate a method for fabricating a capacitor in accordance with a second embodiment of the present invention.

Figure 3A:
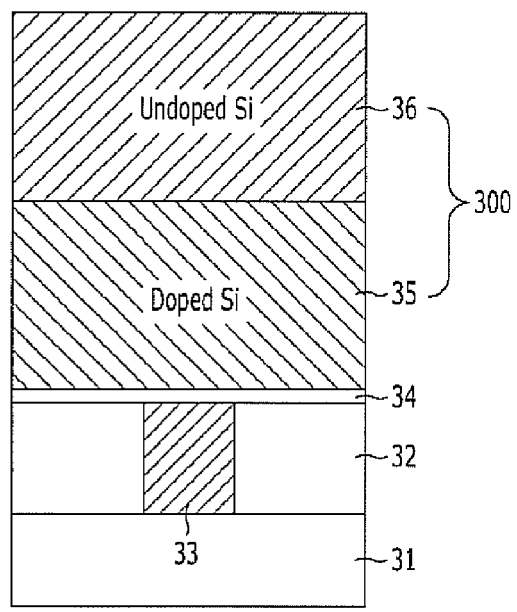
FIGS. 3A to 3G illustrate a method for fabricating a capacitor in accordance with a second embodiment of the present invention.

Referring to FIG. 3A, an interlayer dielectric layer 32 is formed over a semiconductor substrate 31 in which structures such as transistors, word lines, and bit lines are formed. At this time, the interlayer dielectric layer 32 may include any one single layer selected from the group consisting of oxide, nitride, and oxynitride or a stacked layer of two or more foregoing layers. The semiconductor substrate 31 may include a silicon-containing material, and a landing plug and the like may be formed over the semiconductor substrate 31.

A plurality of storage node contact plugs 33 are formed through the interlayer dielectric layer 32. The storage node contact plug 33 may be formed of poly silicon or metal. The metal may include W, Ti, and TiN. Furthermore, the storage node contact plug 33 may be formed by sequentially stacking a polysilicon layer, a barrier layer, and a metal layer.

An etch stop layer 34 is formed over the interlayer dielectric layer 32 having the storage node contact plugs 33 formed therein. For example, the etch stop layer 34 may be formed of nitride such as silicon nitride.

A mold silicon layer 300 is formed over the etch stop layer 34. The mold silicon layer 300 may include amorphous silicon or polysilicon. The polysilicon may be formed by the following process: amorphous silicon is formed, and subsequently, annealing is performed to crystallize the amorphous silicon. The annealing may include furnace annealing and rapid annealing, and may be performed in the range of 500 to 800° C.

The mold silicon layer 300 may be formed by stacking a first silicon layer 35 and a second silicon layer 36. Any one of the first and second silicon layers 35 and 36 may be doped, and the other may be undoped. For example, the first silicon layer 35 may be doped, and the second silicon layer 36 may be undoped. In this case, the first silicon layer 35 is doped silicon, and the second silicon layer 36 is undoped silicon. A dopant used to dope the first silicon layer 35 may include boron or phosphorous. In particular, when phosphorous is doped, the oxidation rate of the first silicon layer 35 increases. The doping concentration of the dopant may be selected from the range of $1\times10^{18}$ to $1\times10^{22}$ atoms/cm$^3$. The first silicon layer 35 may be heavily doped and may be said to have a heavy doping concentration.

The thicknesses of the first and second silicon layers 35 and 36 may each be set in the range of 1 kÅ to 10 kÅ, and the sum of thicknesses of the first and second silicon layers 35 and 36 may equal 20 kÅ at the maximum. The heights of the first and second silicon layers 35 and 36 may be set differently depending on the height of a storage node.

The first and second silicon layers 35 and 36 may be deposited by CVD, and deposition equipment may include furnace-type equipment or chamber-type equipment.

The first and second silicon layers 35 and 36 may be formed by a single deposition process, or formed by separate deposition processes, respectively. The dopant doped in the first silicon layer 35 may be insitu-doped when the first silicon layer 35 is deposited. For example, $Si_2H_6$ or $SiH_4$ may be used to deposit the first silicon layer 35 while passing $PH_3$.

When the first and second silicon layers 35 and 36 are formed of amorphous silicon, a heat treatment may be performed after the deposition. The first and second silicon layers 35 and 36 may be crystallized by the heat treatment. Therefore, the first and second silicon layers 25 and 26 may become polysilicon layers. The heat treatment may be omitted according to different design needs.

Figure 3B:
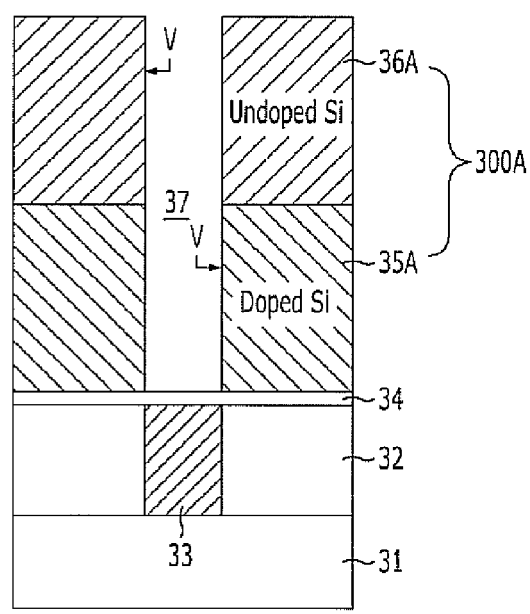

Referring to FIG. 3B, a hard mask pattern (not illustrated) is formed over the mold silicon layer 300. Using the hard mask pattern as an etch barrier, the mold silicon layer 300 including the second silicon layer 36 and the first silicon layer 35 is etched until the etch stop layer 34 is exposed, thereby forming an opening 37. The opening 37 is a region where a storage node is to be formed, and may be formed in a hole shape. The etch process for forming the opening 37 may be performed by a dry etch process. For example, the etch process for forming the opening 37 may be performed using a gas mixture in which HBr and $Cl_2$ are mixed. The etch process for forming the opening 37 may include a chemical dry etch process. When the second and first silicon layers 36 and 35 are etched, an etch rate at the first silicon layer 35 is increased due to the presence of the dopant doped in the first silicon layer 35. Accordingly, the sidewalls of the opening 37 have a vertical profile, and a failure to open is prevented. As the doping concentration of the dopant doped in the first silicon layer 35 becomes higher, the etch rate increases. Therefore, an optimized etching rate may be selected by controlling the doping concentration of the dopant.

The opening 37 formed by the above-discussed series of etch processes is formed between stacked structures of the first and second silicon layer patterns 35A and 36A of a mold silicon layer pattern 300A. Furthermore, the opening 37 has a vertical profile. Both of the first and second silicon layer patters 35A and 36A have a vertical profile V. Meanwhile, when both of the first and second silicon layers 35 and 36 are undoped, a sloped profile may appear due to the characteristics of the dry etch process. In particular, as the aspect ratio further increases, a sloped profile is more likely to appear. In the second embodiment of the present invention, since the doped first silicon layer 35 is applied, a sloped profile may be prevented, and the vertical profile may be obtained.

Figure 3C:
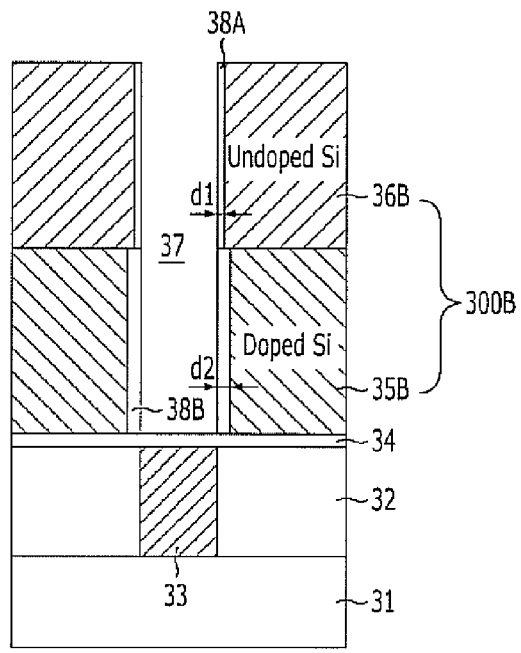

Referring to FIG. 3C, a surface treatment is performed on the mold silicon layer pattern 300A including the first and second silicon layer patterns 35A and 36A having the opening 37 formed therein. At this time, while the surface treatment is performed, damage of the storage node contact plug 33 may be prevented by the etch stop layer 34 under the opening 37.

The surface treatment may include an oxidation process. The oxidation process may be selected from plasma oxidation, thermal oxidation, in-situ steam generation (ISSG), water vapor generation (WVG), and radical oxidation.

Through the surface treatment, silicon oxide layers 38A and 38B serving as sacrificial layers are formed on the surfaces of the first and second silicon layer patterns 35A and 36A. The silicon oxide layers 38A and 38B are formed at different oxidation rates on the surfaces of the first and second silicon layer patterns 35A and 36A, respectively. For example, the oxidation rate on the surface of the first silicon layer pattern 35A is higher than on the surface of the second silicon layer pattern 36A. Therefore, the thickness d2 of the silicon oxide layer 38B formed on the surface of the first silicon layer pattern 35A is larger than the thickness d1 of the silicon oxide layer 38A formed on the second silicon layer pattern 36A. The silicon oxide layers 38A and 38B may be formed to a thickness of 10~100 Å.

After the silicon oxide layers 38A and 38B are formed, the mold silicon layer pattern, and the first and second silicon layer patterns are represented by reference numerals '300B', '35B' and '36B', respectively.

Figure 3D:
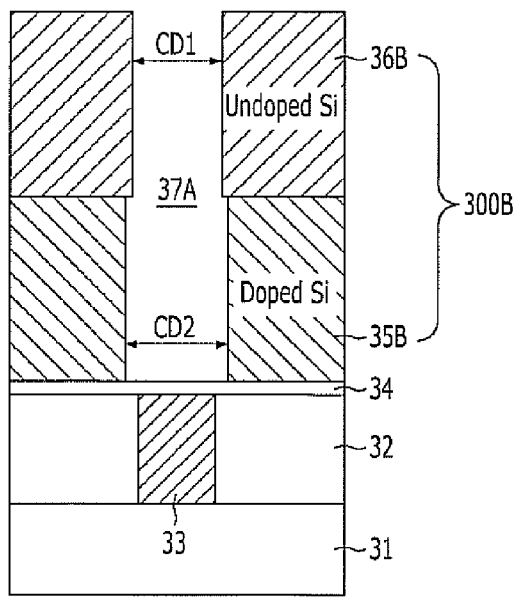

Referring to FIG. 3D, the silicon oxide layers 38A and 38B are selectively removed. Accordingly, the area of the opening 37 is expanded to an opening 37A. In particular, the lower part of the opening 37A is further expanded. The silicon oxide layers 38A and 38B may be removed through a dry etch process or wet etch process. The wet etch process is performed using a hydrofluoric acid-based chemical, and the dry etch process is performed using fluorine-based gas.

When the silicon oxide layers 38A and 38B are removed, the upper and lower parts of the opening 37A have different critical dimensions (CD), respectively. For example, the top CD CD1 of the opening 37A is smaller than the bottom CD CD2 of the opening 37A.

Figure 3E:
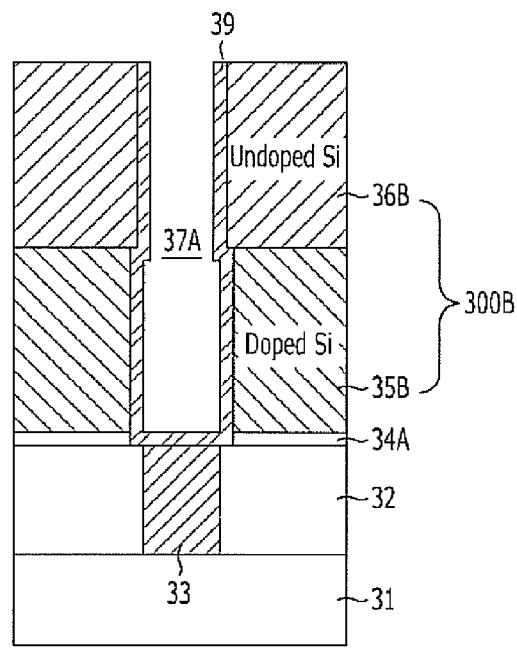

Referring to FIG. 3E, the etch stop layer 34 under the opening 37A is etched to expose the storage node contact plug 33.

A storage node 39 is formed in the opening 37A. The storage node 39 may include a three-dimensional structure such as a cylinder-type structure or pillar-type structure. In this embodiment of the present invention, a cylinder-type storage node is formed. The storage node 39 may be formed by a storage node separation process. The storage node separation process is performed as follows: a conductive layer is formed on the entire surface of the resultant structure including the opening 37A and subsequently planarized by chemical mechanical polishing (CMP) or the like. Accordingly, the conductive layer is left, for example, only in the opening 37A, and the left conductive layer becomes a cylinder-type storage node 39. The storage node 39 may include a metal such as TiN, W, or a noble metal.

Figure 3F:
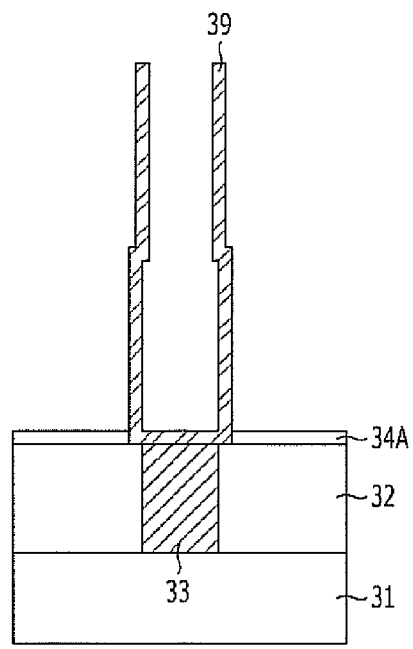

Referring to FIG. 3F, the first and second silicon layer patterns 35B and 36B are removed. The first and second silicon layer patterns 35B and 36B may be removed by a dry etch process or wet etch process. When the first and second silicon layer patterns 35B and 36B are removed by a dry etch process, the dry etch process may be performed using a gas mixture in which HBr and $Cl_2$ are mixed. When the first and second silicon layer patterns 25A and 26A are removed by a wet etch process, the wet etch process may be performed using $HNO_3$.

Figure 3G:
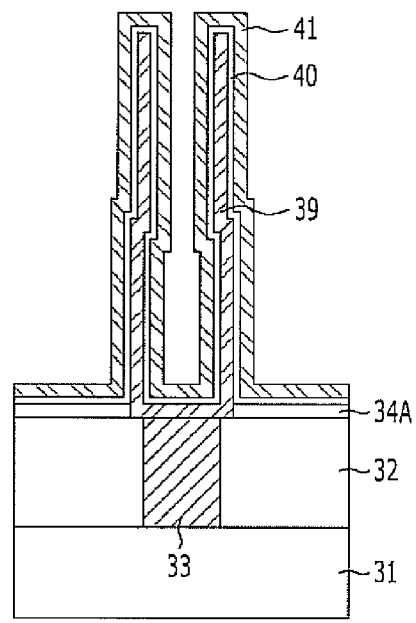

Referring to FIG. 3G, a dielectric layer 40 and a plate node 41 are formed over the storage node 39. The storage node 39 may be referred to as a bottom electrode, and the plate node 41 may be referred to as a top electrode.

Figure 3H:
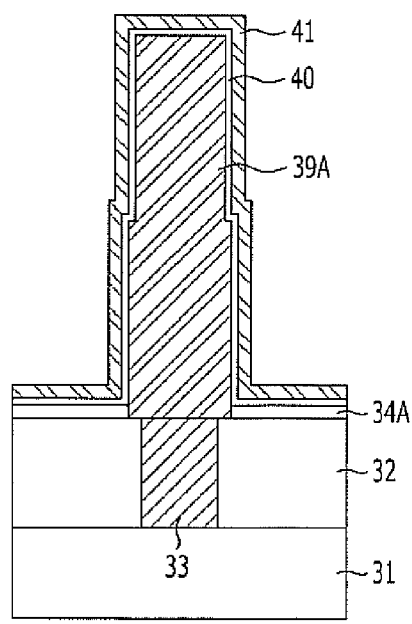
FIG. 3H illustrates a capacitor in accordance with a modification of the second embodiment of the present invention.

FIG. 3H illustrates a capacitor in accordance with a modification of the second embodiment of the present invention. In the capacitor, a storage node 39A has a pillar shape.

In the first and second embodiments of the present invention, the mold silicon layer is formed by stacking the doped silicon layer and the undoped silicon layer. In other embodiments, the mold silicon layer may be formed as follows.

Figure 4:
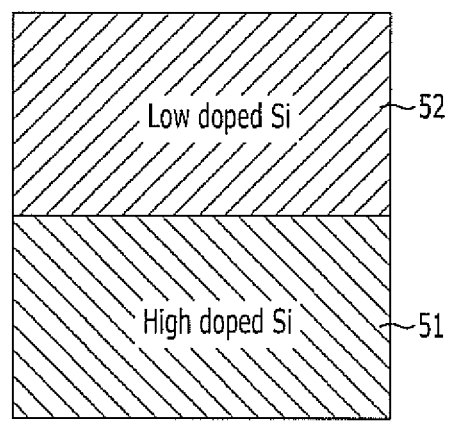
FIG. 4 illustrates a mold silicon layer in accordance with a third embodiment of the present invention.

FIG. 4 illustrates a mold silicon layer in accordance with a third embodiment of the present invention.

Referring to FIG. 4 in accordance with the third embodiment of the present invention, the mold silicon layer may be formed by stacking a first silicon layer 51 and a second silicon layer 52. The first and second silicon layers 51 and 52 may include silicon layers having different doping concentrations, respectively. For example, the first silicon layer 51 may include high-doped silicon, and the second silicon layer 52 may include low-doped silicon. The dopant doped in the first and second silicon layers 35 and 36 may include boron or phosphorous. The dopant may be insitu-doped when the first and second silicon layers 51 and 52 are deposited. The doping concentration of the dopant doped in the first silicon layer 51 may be selected to be within the range of $1 \times 10^{18}$ to $1 \times 10^{22}$ atoms/cm$^3$. The same dopant may be doped in the first and second silicon layers 51 and 52. Therefore, the first and second silicon layers 51 and 52 may have different doping concentrations even though they are doped with the same dopant. The doping concentration of the dopant doped in the second silicon layer 52 is smaller than $1 \times 10^{18}$ atoms/cm$^3$. When the dopant is insitu-doped, the crystallization temperatures of the first and second silicon layers 51 and 52 differ from each other. For example, when boron or phosphorous is doped, the crystallization temperature decreases. Accordingly, when the crystallization temperature decreases, damage on the lower structure is reduced to thereby improve warp characteristics. Furthermore, the etch rate of the high-doped first silicon layer 51 is higher than that of the low-doped second silicon layer 52. Therefore, as the mold silicon layer is formed by stacking silicon layers having different etch rates, a vertical profile may be obtained during a subsequent etch process for forming an opening.

The thicknesses of the first and second silicon layers 51 and 52 may be set in the range of 1 kÅ to 10 kÅ, and the sum of thicknesses of the first and second silicon layers 51 and 52 may approach 20 kÅ at the maximum. The heights of the first and second silicon layers 51 and 52 may be set differently depending on the height of a storage node.

The first and second silicon layers 51 and 52 may be deposited by CVD, and deposition equipment may include furnace-type equipment or chamber-type equipment.

The first and second silicon layers 51 and 52 may be formed by a single deposition process, or formed by separate deposition processes, respectively. The dopant doped in the first silicon layer 51 may be insitu-doped when the first silicon layer 51 is deposited. The dopant doped in the second silicon layer 52 may be insitu-doped when the second silicon layer 52 is deposited. For example, the first and second silicon layer 51 and 52 may be deposited while passing $PH_3$. Accordingly, the first and second silicon layer 51 and 52 are crystallized at the same time as they are deposited. As described above, the crystallization temperature may be reduced by the insitu doping.

Figure 5:
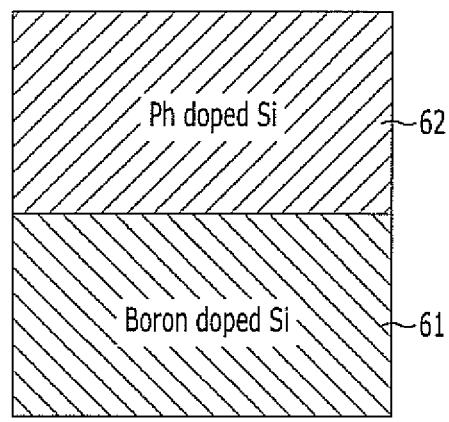
FIG. 5 illustrates a mold silicon layer in accordance with a fourth embodiment of the present invention.

FIG. 5 illustrates a mold silicon layer in accordance with a fourth embodiment of the present invention. The mold silicon layer may be formed by stacking a first silicon layer 61 and a second silicon layer 62. The first silicon layer 61 may include boron-doped silicon, and the second silicon layer 62 may include ph-doped silicon.

Boron and phosphorous may be insitu-doped when the first and second silicon layers 61 and 62 are deposited. The doping concentrations of boron and phosphorous may be equal to each other. For example, the doping concentrations of boron and phosphorous may be selected from the range of $1 \times 10^{18}$ to $1 \times 10^{22}$ atoms/cm$^3$. Therefore, while the first and second silicon layers 61 and 62 have the same doping concentration, they may become mold silicon layers doped with different dopants, respectively. As the dopants are insitu-doped, the crystallization temperatures of the first and second silicon layers 61 and 62 decrease. When the crystallization temperatures decrease, damage on the lower structure is reduced to thereby improve warp characteristics. Furthermore, the boron-doped first silicon layer 61 has a higher etch rate than the phosphorous-doped second silicon layer 62. As the silicon layers having different dry etch rates are stacked to form the mold silicon layer, a vertical profile may be obtained during a subsequent etch process for forming an opening.

The thicknesses of the first and second silicon layers 61 and 62 may be set in the range of 1 kÅ to 10 kÅ, and the sum of thicknesses of the first and second silicon layers 61 and 62 may approach 20 kÅ at the maximum. The heights of the first and second silicon layers 61 and 62 may be set differently depending on the height of a storage node.

The first and second silicon layers 61 and 62 may be deposited by CVD, and deposition equipment may include furnace-type equipment or chamber-type equipment.

The first and second silicon layers 61 and 62 may be formed by a single deposition process, or formed by separate deposition processes, respectively. The boron doped in the first silicon layer 61 may be insitu-doped when the first silicon layer 61 is deposited. The phosphorous doped in the second silicon layer 62 may be insitu-doped when the second silicon layer 62 is deposited. The crystallization temperature may be reduced by the insitu doping.

In other embodiments, the mold silicon layer may be formed in such a manner as to have a concentration gradient. For example, the mold silicon layer may be formed by stacking a plurality of silicon layers having different doping concentrations, respectively. At this time, the doping concentrations of the respective silicon layers may be set to increase from the lowermost silicon layer to the uppermost silicon layer. For example, the lowermost silicon layer may be set to the highest doping concentration, and the uppermost silicon layer may be set to the lowest doping concentration. Alternatively, the mold silicon layer may consist of one silicon layer of which the doping concentration decreases as the thickness thereof is increased.

Figure 6A:
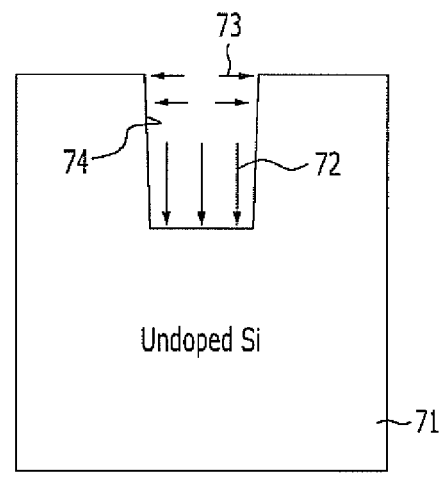
FIGS. 6A and 6B illustrate examples in which an undoped silicon layer is formed.
Figure 6B:
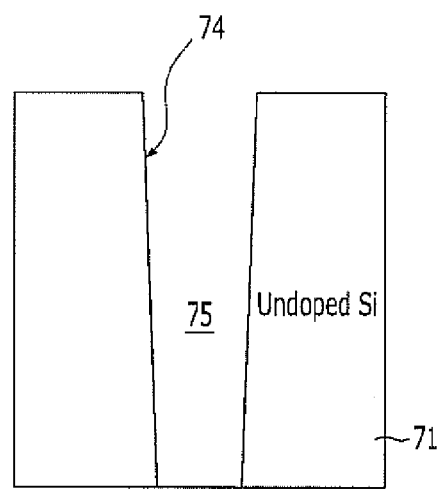

FIGS. 6A and 6B illustrate examples in which, for example, only an undoped silicon layer is formed, that is, a mold silicon layer consists of, for example, only an undoped silicon layer.

Referring to FIGS. 6A and 6B, when an undoped silicon layer 71 is applied alone as a mold silicon layer, an etch profile close to a right angle may be obtained after an opening 75 is formed. Therefore, a high aspect ratio etch process capable of obtaining an aspect ratio of 70 or more may be obtained. However, although the undoped silicon layer 71 is more advantageous in etch profile than a mold oxide layer, it is difficult to obtain an etch profile close to 90 degrees when the height of the mold silicon layer is 2 μm or more. For example, since a horizontal etch 73 is performed at the same time as a vertical etch 74 is performed in the upper region during the initial etch process, a sloped profile appears. Since the sloped profile is reflected even though the etch is continuously performed, the bottom CD of the opening 75 becomes smaller than the top CD thereof. When the top CD of the opening 75 decreases, a distance between storage nodes significantly decreases, and thus a short circuit may occur. Even when a doped silicon layer is applied alone as the mold silicon layer, a sloped profile may appear.

When the slope is less than 90 degrees, a high aspect ratio may be difficult to obtain. As a result, the area of the opening 75 decreases, and capacitance decreases to thereby degrade the characteristics of the capacitor. Meanwhile, the height may be further increased to increase the opening area. In this case, however, since the slope is not improved, integration may be degraded by horizontal loss in the upper part of the opening.

As described above in the embodiments of the present invention, the doped silicon layer and the undoped silicon layer may be stacked as the mold silicon layer, the high-doped silicon layer and the low-doped silicon layer may be stacked as the mold silicon layer, or the boron-doped silicon layer and the phosphorous-doped silicon layer may be stacked as the mold silicon layer, thereby obtaining a vertical profile of the opening. When the silicon layer having a low etch rate is etched, a sloped profile may appear. However, when the silicon layer having a high etch rate is etched, the sloped profile is removed. Therefore, the opening has a vertical profile.

In accordance with the embodiments of the present invention, the mold silicon layer including doped silicon may be applied to obtain a vertical profile. Furthermore, since the etch rate is improved by the doped dopant, a failure to open may be prevented.

Furthermore, the mold silicon layer including doped silicon may be applied to further increase the area of the capacitor and thus high capacitance may be obtained.

Furthermore, as the structural stability is improved by the increase in lower area of the storage node, leaning may be prevented and a capacitor with high reliability may be fabricated.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a capacitor, comprising:
   forming an etch stop layer over a semiconductor substrate having a storage node contact plug formed therein;
   forming a first silicon layer over the etch stop layer, wherein the first silicon layer is doped with a dopant;
   forming an undoped second silicon layer over the first silicon layer;
   forming an opening by etching the second silicon layer and the first silicon layer;
   forming a silicon oxide layer on sidewalls of the opening by oxidizing the first silicon layer and the second silicon layer;
   expanding the opening by removing the silicon oxide layer;
   etching the etch stop layer under the expanded opening;
   forming a storage node in the expanded opening; and
   removing the first silicon layer and the second silicon layer,
   wherein the first and second silicon layers comprise amorphous silicon and are heat-treated during a subsequent process.

2. The method of claim 1, wherein the first and second silicon layers comprise amorphous silicon.

3. The method of claim 1, wherein the dopant doped in the first silicon layer comprises boron or phosphorous.

4. The method of claim 1, wherein the doping concentration of the dopant doped in the first silicon layer is in the range of $1 \times 10^{18}$ to $1 \times 10^{22}$ atoms/cm$^3$.

5. The method of claim 1, wherein, in the forming of the first silicon layer, the dopant is insitu-doped when the first silicon layer is deposited.

6. The method of claim 1, wherein the forming of the silicon oxide layer is performed by a process selected from plasma oxidation, thermal oxidation, in-situ steam generation (ISSG), water vapor generation (WVG), and radical oxidation.

\* \* \* \* \*